United States Patent
Yoshida et al.

(10) Patent No.: US 8,145,951 B2
(45) Date of Patent: Mar. 27, 2012

(54) CONTROL DEVICE

(75) Inventors: Yukitaka Yoshida, Tokyo (JP); Kenji Shigihara, Tokyo (JP); Yoshiyuki Nitta, Tokyo (JP); Yuuichi Sato, Saitama (JP); Takashi Omagari, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 46 days.

(21) Appl. No.: 12/814,159

(22) Filed: Jun. 11, 2010

(65) Prior Publication Data

US 2010/0251019 A1 Sep. 30, 2010

Related U.S. Application Data

(63) Continuation-in-part of application No. PCT/JP2008/003697, filed on Dec. 10, 2008.

(30) Foreign Application Priority Data

Dec. 14, 2007 (JP) ................................. 2007-322839

(51) Int. Cl.
*G06F 11/00* (2006.01)
(52) U.S. Cl. ............... 714/40; 714/6.1; 714/36; 714/42; 713/1; 713/2
(58) Field of Classification Search .................. 714/6.1, 714/36, 42, 40; 713/1, 2
See application file for complete search history.

(56) References Cited

U.S. PATENT DOCUMENTS

| | | | | |
|---|---|---|---|---|
| 5,077,737 A | * | 12/1991 | Leger et al. | 714/6.1 |
| 6,038,680 A | * | 3/2000 | Olarig | 714/6.1 |
| 7,971,124 B2 | * | 6/2011 | Spanel et al. | 714/768 |
| 7,995,301 B2 | * | 8/2011 | Oberg | 360/69 |
| 2008/0301529 A1 | * | 12/2008 | Spanel et al. | 714/765 |
| 2008/0301530 A1 | * | 12/2008 | Spanel et al. | 714/765 |

FOREIGN PATENT DOCUMENTS

| | | |
|---|---|---|
| JP | 58-023397 | 2/1983 |
| JP | 06-052065 | 2/1994 |
| JP | 06-175934 | 6/1994 |
| JP | 10-133899 | 5/1998 |
| JP | 2000-132462 | 5/2000 |
| WO | WO 2007/010829 | 1/2007 |

* cited by examiner

*Primary Examiner* — Charles Ehne
(74) *Attorney, Agent, or Firm* — Oblon, Spivak, McClelland, Maier & Neustadt, L.L.P.

(57) ABSTRACT

A control device includes: memory diagnosis means for setting a power-on status when an electric power is turned on and diagnosing an ECC memory; restarting means for restarting the control device when the memory diagnosis means detects a correctable error of the ECC memory during the power-on status of the ECC memory; and operation processing means for resetting the power-on status and performing a normal operation when the memory diagnosis means does not detect a correctable error of the ECC memory, while performing the normal operation when a correctable error of the ECC memory is detected because of the restart of the control device by soft reset after the reset of the power-on status but when the control device is not in the power-on status.

4 Claims, 16 Drawing Sheets

CONTROL DEVICE

CROSS REFERENCES TO RELATED APPLICATIONS

This application is a continuation-in-part (CIP) application based upon the International Application PCT/JP2008/003697, the International Filing Date of which is Dec. 10, 2008, the entire content of which is incorporated herein by reference, and claims the benefit of priority from the prior Japanese Patent Application No. 2007-322839, filed in the Japanese Patent Office on Dec. 14, 2007, the entire content of which is incorporated herein by reference.

BACKGROUND OF THE INVENTION

The present invention relates to a control device that uses an ECC (Error Check and Correct) memory having a function of automatically correcting errors.

In a control device of an electric power generation plant or the like, an ECC memory is used for a main memory (main storage unit) to store control data that a CPU (central processing unit) reads and writes directly. When data is stored in the memory, the ECC memory adds an error-correcting code, ECC, that is different from the original data before the data is stored in the memory, thereby enabling errors to be corrected or detected.

In general, if the error-correcting code corresponding to data n is m, a unique error-correcting code generation function m=f(n) is found that turns (n & m) into a code word having a certain hamming distance and, instead of n, {n & f(n)} is stored in the memory as a code word to realize the ECC memory.

In general, as the number of errors increases, the situation changes from one in which errors can be corrected to one in which errors can be detected but not corrected, and eventually to one in which errors cannot be either detected or corrected. For example, if a code word with a hamming distance of 4 includes a 1-bit error, then the code word is not a code word because the code word has moved by a distance of 1 from the previous value that has yet to have the error. Since the code word is not a code word, it can be determined that the code word contains an error. Moreover, there is only one code word that is closest to the value, and it can be determined that the value is the previous code word that has yet to have the error. Therefore, the use of the value as a correct value can be regarded as making a correction.

If a code word with a hamming distance of 4 includes a 2-bit error, then the code word is similarly not a code word. Therefore, an error can be detected but not corrected because there could be two or more code words that are closest to the value. If a code word with a hamming distance of 4 includes a 3-bit error, then the code word is similarly not a code word. Therefore, an error can be detected but error correction may result in an error because the code word closest to the value is not necessarily the previous code word that has yet to contain an error. If a code word with a hamming distance of 4 includes a 4-bit error, then the code word can be a code word even if the code word includes an error. Therefore, the error may not be detected. That is, for a code word with a hamming distance of 4, an 1-bit error can be corrected and a 2-bit error can be detected. Accordingly, the ability to correct (and detect) errors of the ECC memory is dependent on the hamming distance of a generated code word.

A device using the ECC memory can read data that is corrected when data is read out owing to the error correction function of the ECC memory if the number of errors is within a range that allows correction. However, an error stored in the memory usually remains uncorrected.

There is a memory control circuit that corrects an error promptly after the error is detected in read data before writing the data in order to improve the reliability of the memory (see Japanese Patent Application Laid-open Publication No. 6-52065 (Patent Document 1), for example). That is, if an error stored in the memory is a soft error (temporary error), error correction can be made by storing data again (or overwriting data). Storing data again means that correct data and a new error-correcting code generated from the correct data are to be stored. As a result, the data is, in effect, corrected. Because of the one disclosed in Patent Document 1, the simple updating of data that is routinely carried out by the operation of the control device, and the like, it is unlikely that soft errors will continue to increase in the control device using the ECC memory.

On the other hand, apparently there is a problem that errors caused by permanent defects remain uncorrected and accumulated. If operation goes on under such circumstances, the number of errors stored in the memory could exceed the correction ability of the ECC and the errors can be uncorrectable without any sign of what is about to happen. The current ECC memories have such a characteristic.

The problem here is that it is impossible to predict the timing when errors turn into uncorrectable errors. If the timing when errors turn into uncorrectable errors is predictable, it is possible to stop the control device at an appropriate timing for maintenance. For example, the control device can be stopped for maintenance when the plant controlled by the control device is out of operation. However, if the timing when errors turn into uncorrectable errors is not predictable, the unplanned, immediate suspension of the plant and the like is necessary and the plant and the like can be seriously damaged.

That is, the ECC memory merely serves for life extension of the device. Even if the timing when errors turn into uncorrectable errors is not predictable, the following procedure may be possible for a control device having the ECC memory correction function which works when data is read out and the function of issuing notice that an error stored in the memory is present: the device may be stopped at an appropriate timing for maintenance each time the notice is issued.

However, if the above error is a soft error, in many cases the error stored in the memory will disappear after the updating of data and the like as described above. Therefore, it is extremely inefficient for the control device to stop each time the notice is issued. In practice, such an operation is not common. Moreover, it is difficult to determine whether the issuing of the notice is associated with errors of software or permanent defects.

Accordingly, what is extremely important is the function to reliably detect that the error stored in the memory is attributable to permanent defects. The reason is that if it is possible to detect the existence of permanent defects, the control device can be stopped at an appropriate timing for maintenance before errors abruptly turn into uncorrectable errors and the plant and the like are seriously damaged.

BRIEF SUMMARY OF THE INVENTION

An object of the present invention is to provide a control device that can detect the existence of permanent defects of the ECC memory to prevent permanent defects from accumulating and turning into uncorrectable ones without any sign of what is about to happen.

In order to achieve the object, according to an aspect of the present invention, there is provided a control device comprising: memory diagnosis means for setting a power-on status when an electric power is turned on and diagnosing an ECC memory; restarting means for restarting the control device when the memory diagnosis means detects a correctable error of the ECC memory during the power-on status of the ECC memory; and operation processing means for resetting the power-on status and performing a normal operation when the memory diagnosis means does not detect a correctable error of the ECC memory, while performing the normal operation when a correctable error of the ECC memory is detected because of the restart of the control device by soft reset after the reset of the power-on status but when the control device is not in the power-on status.

According to another aspect of the present invention, there is provided a control device comprising: correctable error detection means for detecting a correctable error of an ECC memory; permanent defect determination means for storing, when error correction is made during a process of reading out data of the ECC memory, corrected data to a corresponding address and then reading out the data from the same address again, and if error correction is made then, issuing notice that the corresponding address has a permanent defect; and operation processing means for performing a control operation.

According to another aspect of the present invention, there is provided a control device comprising: correctable error detection means for detecting a correctable error of an ECC memory; permanent defect determination means for storing, when error correction is made during a process of reading out data of the ECC memory, a corresponding address, and if error correction is made again on the same address, issuing notice that the corresponding address has a permanent defect; and operation processing means for performing a control operation.

According to another aspect of the present invention, there is provided a control device comprising: correctable error detection means for detecting a correctable error of an ECC memory; memory correction times output means for counting up number of correction times when error correction is made during a process of reading out data of the ECC memory and outputting counted number of the correction times; and operation processing means for performing a control operation.

According to another aspect of the present invention, there is provided a control device comprising: correctable error detection means for detecting a correctable error of an ECC memory; logging means for logging correction events in chronological order when error correction is made during a process of reading out data of the ECC memory; and operation processing means for performing a control operation.

BRIEF DESCRIPTION OF THE DRAWINGS

The above and other features and advantages of the present invention will become apparent from the discussion hereinbelow of specific, illustrative embodiments thereof presented in conjunction with the accompanying drawings, in which.

DETAILED DESCRIPTION OF THE INVENTION

Figure 1:
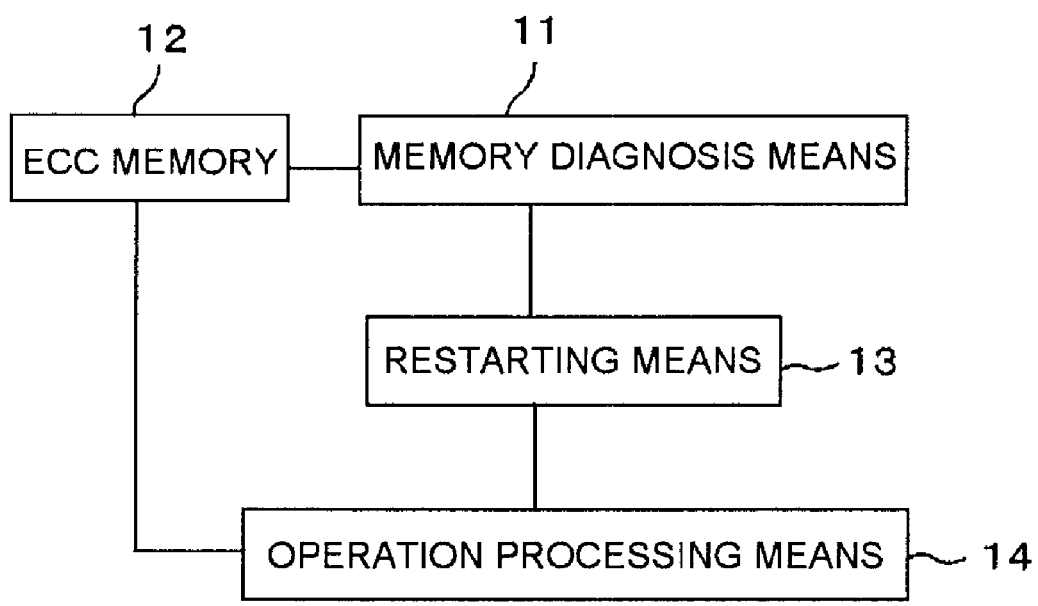
FIG. 1 is a configuration diagram of a control device according to a first embodiment of the present invention.

FIG. 1 is a configuration diagram of a control device according to a first embodiment of the present invention. The control device here is for example one that controls a plant such as an electric power generation plant and uses an ECC memory 12 for storing control data. A memory diagnosis means 11 diagnoses the ECC memory 12 of the control device. When the control device is switched on, the memory diagnosis means 11 sets a power-on status and makes a diagnosis of the ECC memory 12. A restarting means 13 restarts the control device based on the result of diagnosis by the memory diagnosis means 11. An operation processing means 14 uses the ECC memory 12 to carry out the control operation of the control device.

Figure 2:
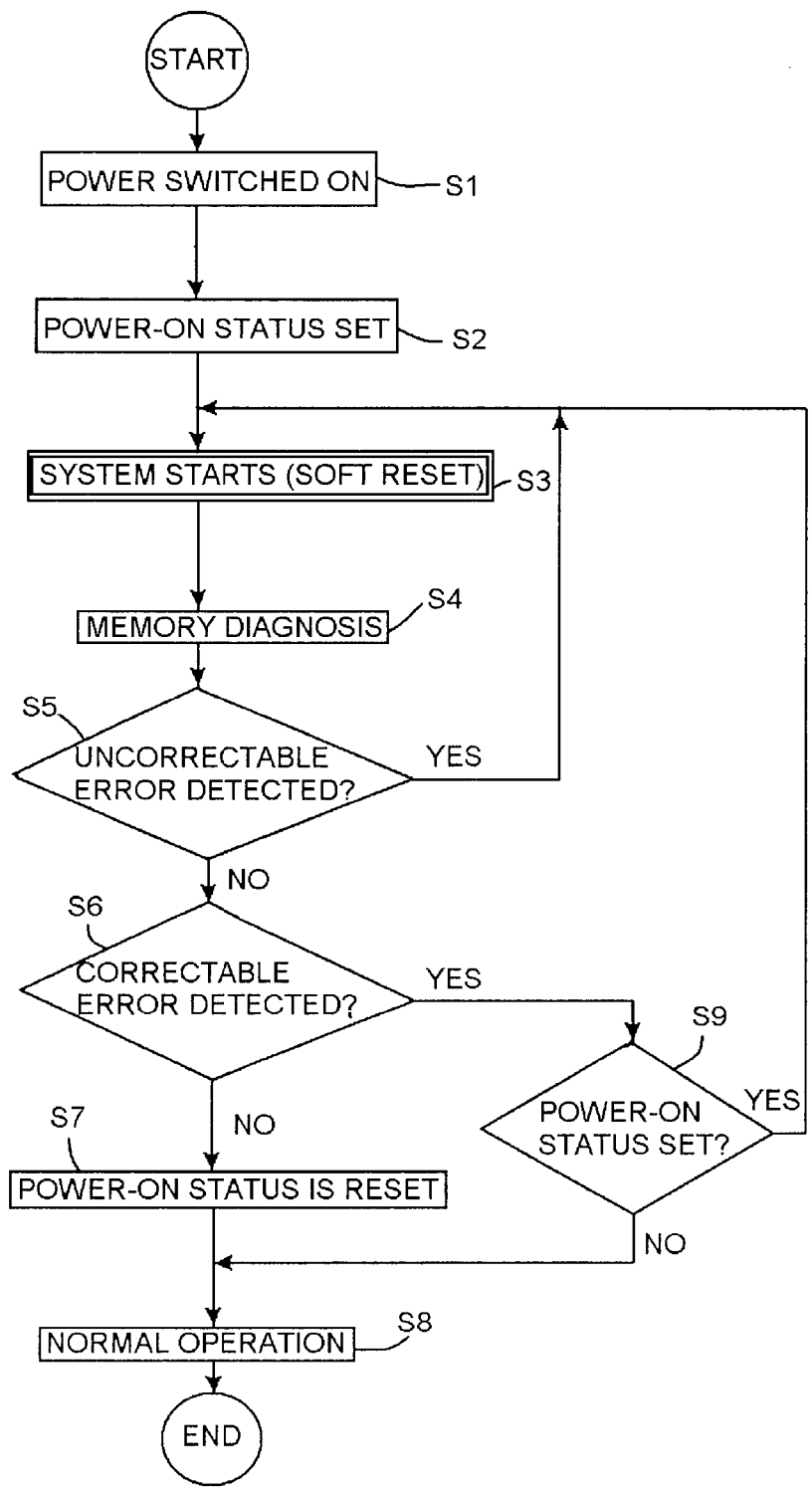
FIG. 2 is a flowchart illustrating an example of the process of the control device according to the first embodiment of the present invention.

FIG. 2 is a flowchart illustrating an example of the process of the control device according to the first embodiment of the present invention. When the control device is switched on (S1), the power-on status is set (S2), and a system starts (S3). Subsequently, the memory diagnosis means 11 makes a diagnosis of the ECC memory (S4), and makes a determination as to whether an uncorrectable error is detected (S5). When an uncorrectable error is detected, the process returns to step S3 to restart the control device. Therefore, when there is an uncorrectable error, the processes of step S3 to S5 are repeatedly performed and, as a result, the normal operation does not go forward. It may be dangerous to carry on the normal operation when an appropriate operation is impossible. However, it is possible to prevent the normal operation from going forward.

When it is determined at step S5 that there is no uncorrectable error, then a determination is made as to whether a correctable error is detected (S6). When a correctable error is not detected, the power-on status is reset (S7), and the operation processing means 14 performs the normal operation (S8). On the other hand, when it is determined at step S6 that a correctable error is detected, a determination is made as to whether the control device is in the power-on status (S9). When the control device is in the power-on status, the process returns to step S3 to restart the control device.

As described above, in the control device using the ECC memory 12, a diagnosis is made on the memory when the control device is turned on and started. If error correction is made when data is read, the control device restarts (S6 and S9). The diagnosis of the memory by the memory diagnosis means 11 is carried out by writing data to all memory areas where the detection of permanent defects should be done and reading out the values of the data. In practice, even when an uncorrectable error is detected, the control device is restarted (S5). The reason is that when the error cannot be corrected, it may also be impossible to perform an appropriate operation.

Restarting is only a soft reset. Therefore, the power-on status is provided that is sure to be set when the control device is turned on. The power-on status is designed to be set when the system is started. Here, suppose that while the power-on status is being set, it is determined that the restart is done by turning on the control device, even if the restart is done by a soft reset.

When error correction is made due to a soft error, the error disappears after the control device restarts, and the process proceeds to the normal operation (S8). However, when error correction is made due to permanent defects, error correction is made again after the control device restarts, and the control device restarts again. As a result, the device having permanent defects cannot proceed to the normal operation (S8) and it becomes impossible to start the control device.

According to the above example, the existence of permanent defects in the ECC memory 12 makes it impossible to start the system. Therefore, the existence of permanent defects of the ECC memory 12 can be detected. Thus, it is possible to prevent permanent defects from accumulating and turning into uncorrectable ones without any sign of what is about to happen.

Optionally, the step (S5) of detecting uncorrectable errors may be omitted.

Figure 3:
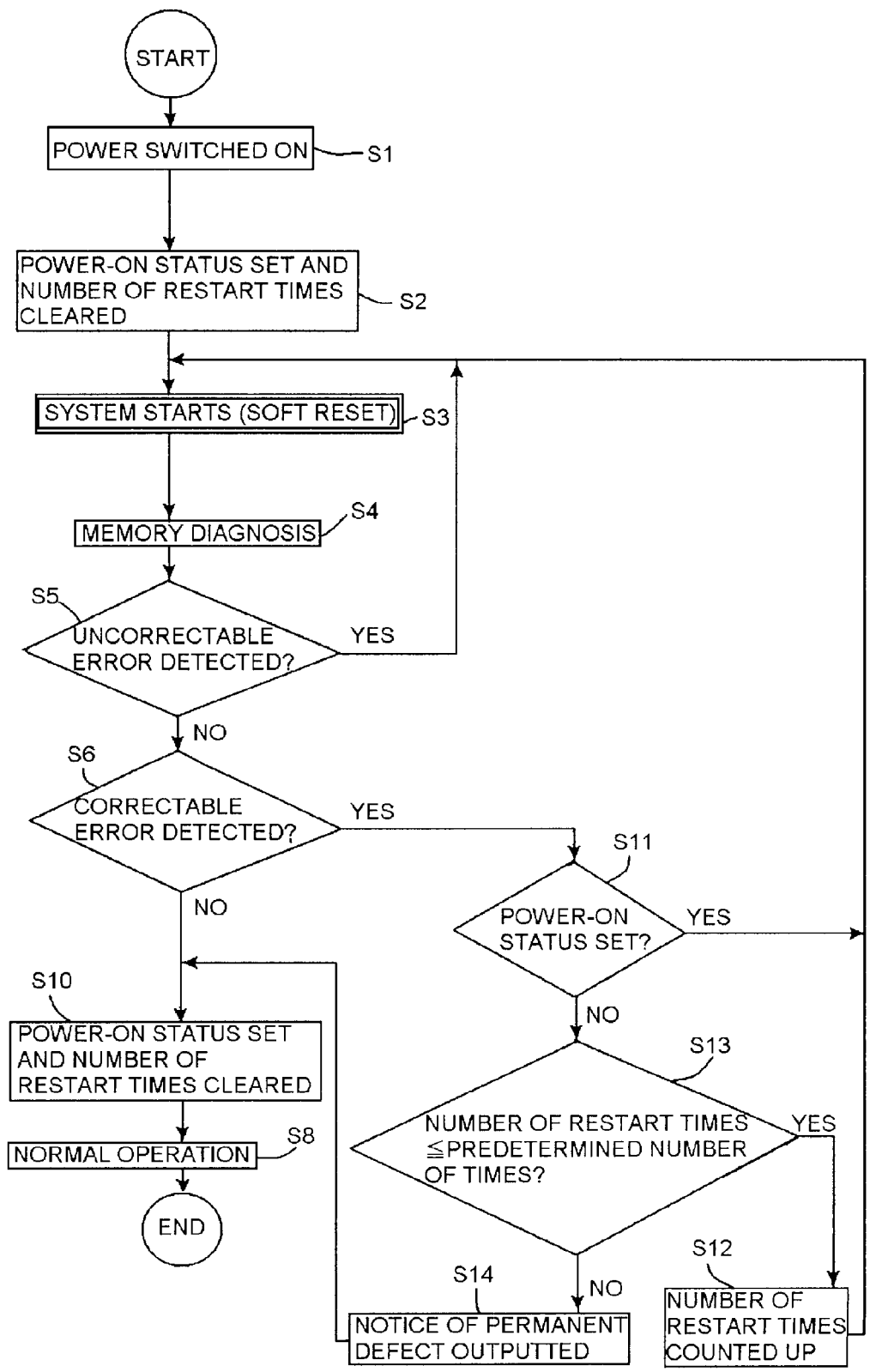
FIG. 3 is a flowchart illustrating another example of the process of the control device according to the first embodiment of the present invention.

FIG. 3 is a flowchart illustrating another example of the process of the control device according to the first embodiment of the present invention. In the example here, as opposed to the example of FIG. 2, a diagnosis of the memory is also made when the control device is restarted by soft reset after the reset of the power-on status. If error correction is made at that time, the control device restarts. The number of times the control device can be successively restarted due to error correction at the time of soft reset after the reset of the power-on status is limited. When the number exceeds the limit, one thing to be done is to issue notice that the number exceeds the limit, and the process proceeds to the normal operation (S8). The same steps as those in FIG. 2 are denoted by the same reference symbols and the corresponding parts will not be described.

As shown in FIG. 3, when it is determined at step S6 that a correctable error is not detected, then the power-on status is reset and the number of restart times is cleared (S10), Then, the operation processing means 14 carries out the normal operation (S8). On the other hand, when it is determined at step S6 that a correctable error is detected, a determination is made as to whether the control device in the power-on status (S11). When the control device is in the power-on status, the process returns to step S3 to restart the control device. When it is determined at step S11 that the control device is not in the power-on status, then a determination is made as to whether the number of restart times is less than or equal to a predetermined number of times (S13). When the number of restart times is less than or equal to the predetermined number of times, then the number of restart times is counted up (S12) and the process returns to step S3 to restart the control device. When it is determined at step S13 that the number of restart times is not less than or equal to the predetermined number of times, then the notice of permanent defect is outputted (S14), the power-on status is reset while the number of restart times is cleared (S10), and the operation processing means 14 performs the normal operation (S8).

For example, the "predetermined number of times" here is one at step S13, in which case the number of restart times is counted up only after the initial restart (S12). When the control device is restarted two or more times, the notice of permanent defect is issued (S14).

As described above, a diagnosis of the memory is made even when the control device is started by soft reset after the reset of the power-on status. When error correction is made, then the control device restarts. However, at the time of soft reset after the reset of the power-on status, there is a limit on the number of times the control device can be successively restarted by error correction. When the number exceeds the limit, one thing to be done is to issue notice that the number exceeds the limit, and the process returns to the normal operation.

According to the above example, the existence of permanent defects can be detected without stopping the system even when the system is being operated after the power is turned on. Therefore, it is possible to prevent permanent defects from accumulating and turning into uncorrectable ones without any sign of what is about to happen.

Figure 4:
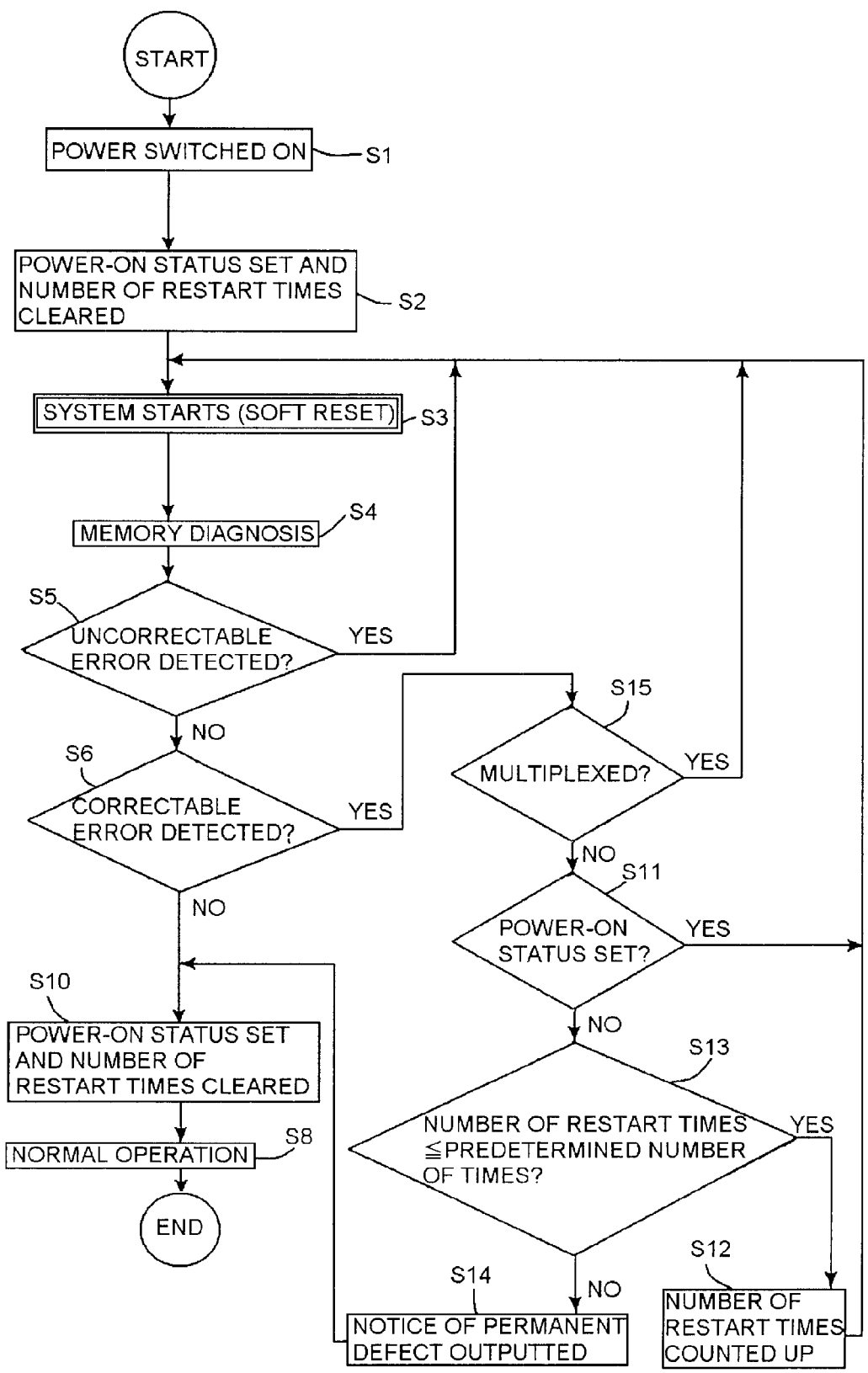
FIG. 4 is a flowchart illustrating yet another example of the process of the control device according to the first embodiment of the present invention.

FIG. 4 is a flowchart illustrating another example of the process of the control device according to the first embodiment of the present invention. In the example here, as opposed to the example of FIG. 3, the number of restart times is limited only when an element from which a permanent defect is detected is not multiplexed. The same steps as those in FIG. 3 are denoted by the same reference symbols and the corresponding parts will not be described.

As shown in FIG. 4, when it is determined at step S6 that a correctable error is not detected, the power-on status is reset and the number of restart times is cleared (S10). Then, the operation processing means 14 performs the normal operation (S8). On the other hand, when it is determined at step S6 that a correctable error is detected, then a determination is made as to whether an element from which the correctable error is detected is multiplexed (S15). When the element is multiplexed, the process returns to step S3 to restart the control device. In this manner, when an element from which the correctable error is detected is multiplexed, the process directly restarts the control device. In this case, the process keeps the ECC memory's system having the permanent defect from restarting. Accordingly, the process proceeds to the operation of the ECC memory's systems not having permanent defects, allowing the control device to carry out the normal operation.

According to the above example, in the multiplexed system, it is possible to keep the ECC memory's system having the permanent defect from restarting. Therefore, it is possible to maintain the memory's system having permanent defects and prevent permanent defects from accumulating and turning into uncorrectable ones without any sign of what is about to happen. Moreover, when one system continues to operate after the failure of the other systems, it is possible to increase operation rates without stopping the system even if there are permanent defects.

Figure 5:
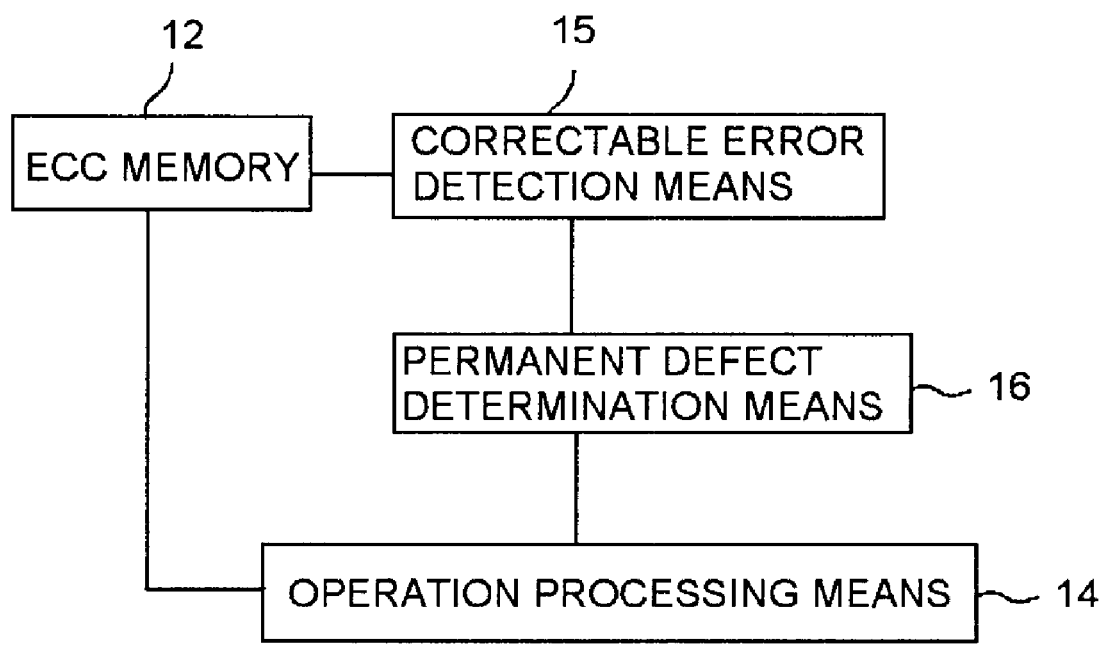
FIG. 5 is a configuration diagram of a control device according to a second embodiment of the present invention.

FIG. 5 is a configuration diagram of a control device according to a second embodiment of the present invention. An operation processing means 14 uses an ECC memory 12 to perform a control operation. A correctable error detection means 15 detects a correctable error of the ECC memory 12. A permanent defect determination means 16 stores, when error correction is made during a process of reading out data of the ECC memory 12, corrected data to the corresponding address and then reads out the data from the same address again. When error correction is made at the time, the permanent defect determination means 16 issues notice that the corresponding address has a permanent defect.

Figure 6:
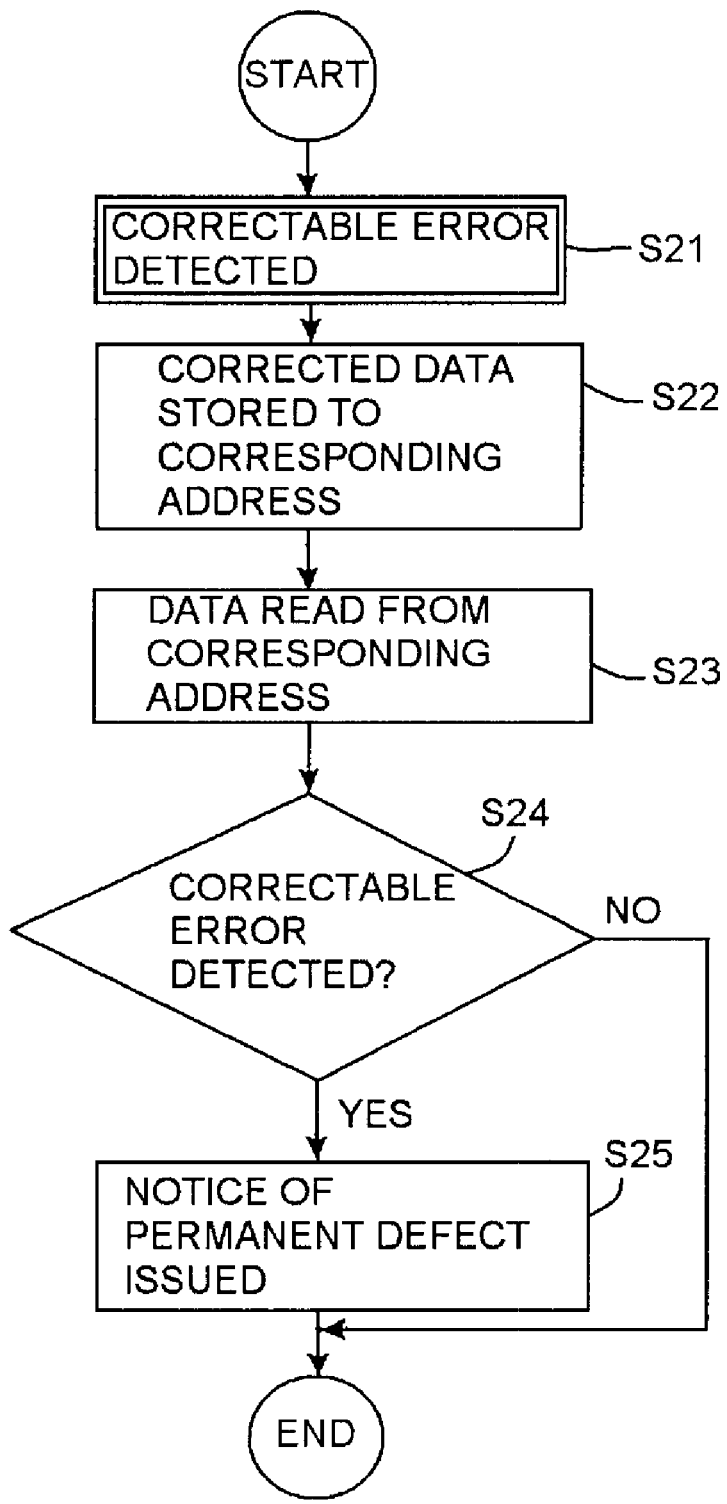
FIG. 6 is a flowchart illustrating an example of the process of the permanent defect determination means of the control device according to the second embodiment of the present invention.

FIG. 6 is a flowchart illustrating an example of the process of the permanent defect determination means of the control device according to the second embodiment of the present invention. When a correctable error is detected by the correctable error detection means 15 (S21), the corrected data is stored to the corresponding address (S22) and data is read from the corresponding address (S23). At this time, a determination is made as to whether error correction is made, i.e. whether a correctable error is detected (S24). When a correctable error is detected, the notice that the corresponding address has a permanent defect is issued (S25).

As described above, in the control device using the ECC memory 12, when error correction is made during a process of reading out data, corrected data is stored to the corresponding address. Then, data is read from the same address again, and, when error correction is made at the time, the notice that the corresponding address has a permanent defect is issued. Therefore, it is possible to detect the existence of permanent defects of the ECC memory 12 and prevent permanent defects from accumulating and turning into uncorrectable ones without any sign of what is about to happen.

Figure 7:
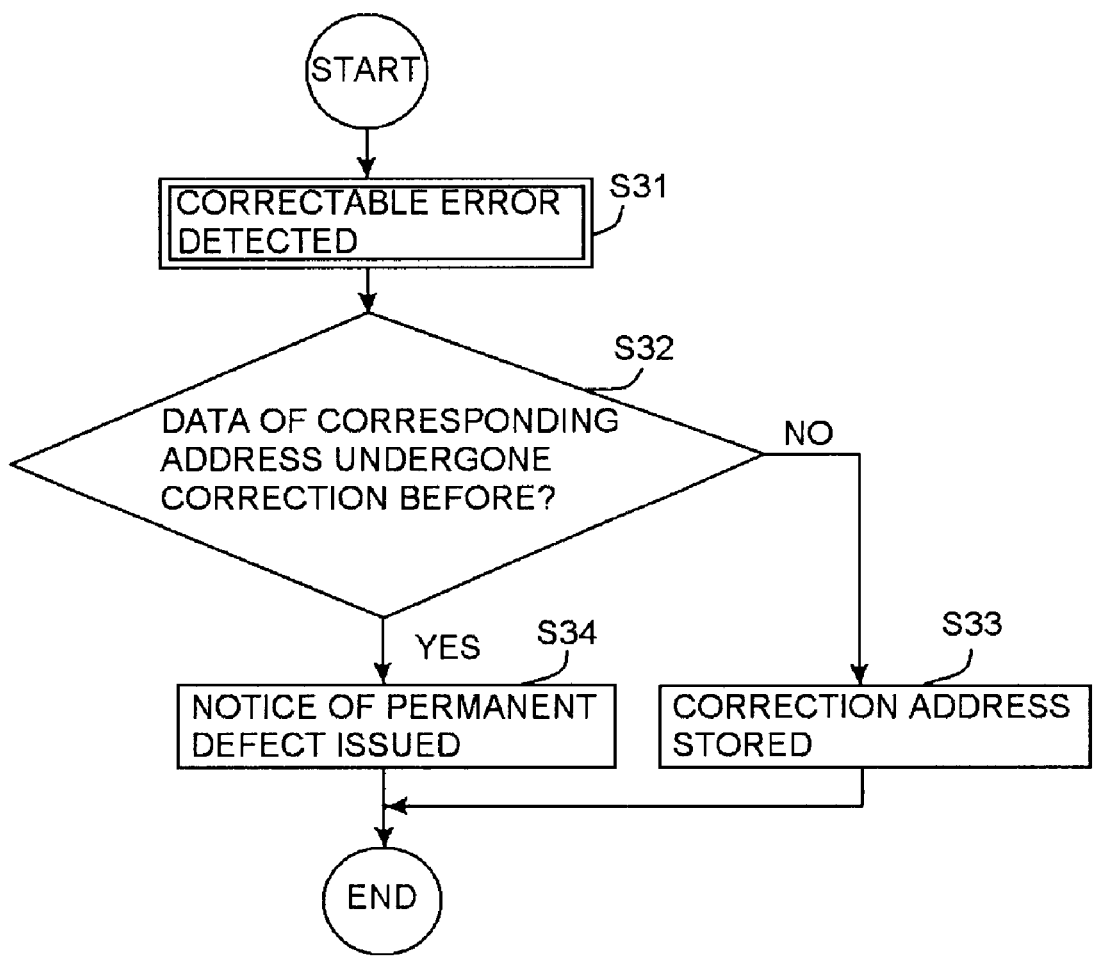
FIG. 7 is a flowchart illustrating another example of the process of the permanent defect determination means of the control device according to the second embodiment of the present invention.

FIG. 7 is a flowchart illustrating another example of the process of the permanent defect determination means of the control device according to the second embodiment of the present invention. When a correctable error is detected by the correctable error detection means 15 (S31), a determination is made as to whether the data of the corresponding address has undergone correction before (S32). When the data has not undergone correction, the correction address is stored (S33). When the data has undergone correction, then the notice of permanent defect is issued (S34).

As described above, in the control device using the ECC memory 12, when error correction is made during a process of reading out data, the corresponding address is stored. When error correction is made again on the same address, the notice that the corresponding address has a permanent defect is issued. Therefore, it is possible to detect the existence of permanent defects of the ECC memory 12 and prevent permanent defects from accumulating and turning into uncorrectable ones without any sign of what is about to happen.

In the process of FIG. 7, the operation of access to the memory is performed fewer times at the time of detection of correctable errors. Therefore, it is easy to realize the control device using hardware. Since the control device is realized by hardware, the control device can be realized without putting a burden on software. However, error detection is less accurate in memory areas where data is not so frequently written.

Figure 8:
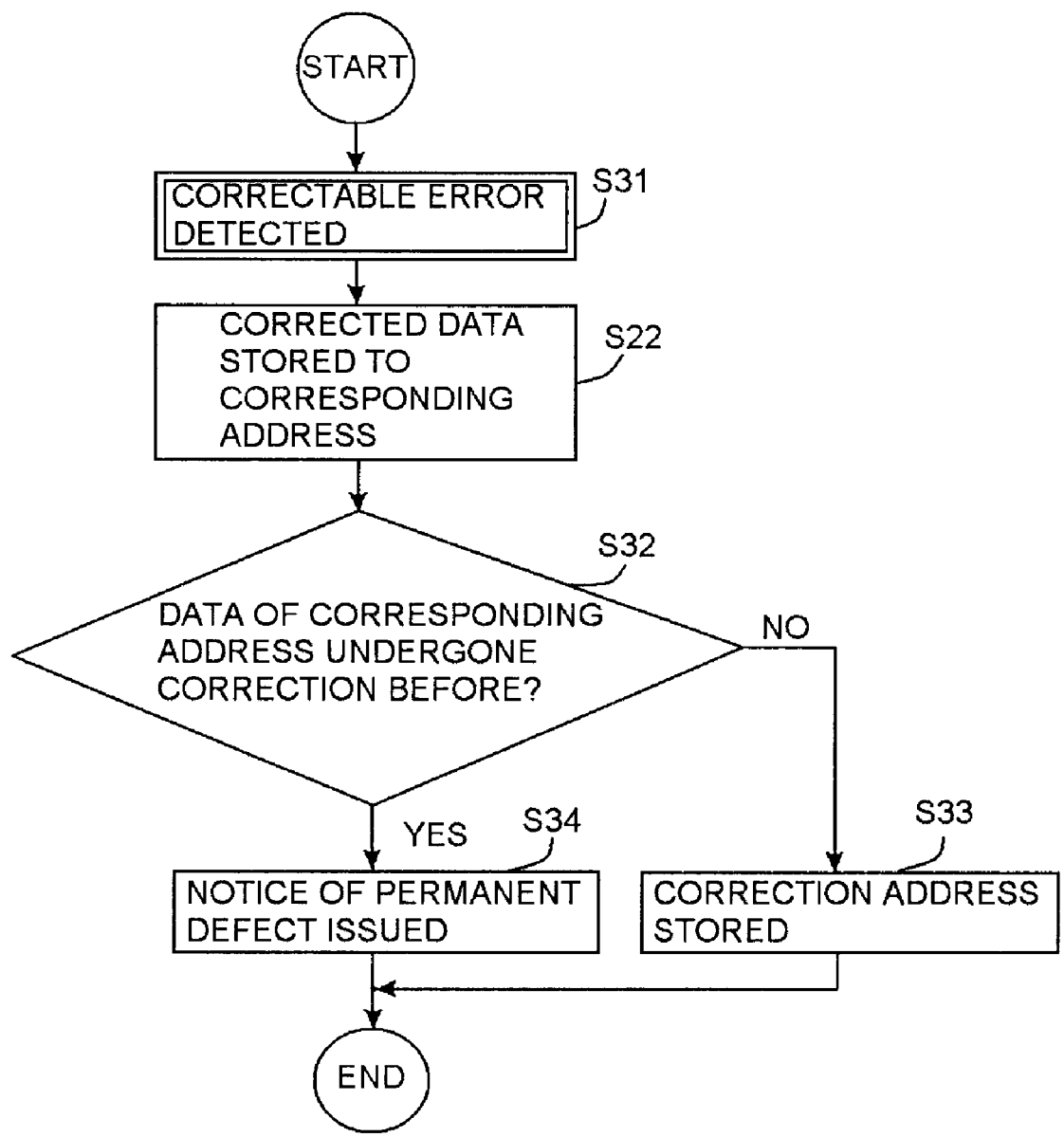
FIG. 8 is a flowchart illustrating another example of the process of the permanent defect determination means of the control device according to the second embodiment of the present invention.

FIG. 8 is a flowchart illustrating another example of the process of the permanent defect determination means of the control device according to the second embodiment of the present invention. In the example here, when a correctable error is detected by the correctable error detection means 15 (S31), the corrected data is stored to the corresponding address in the same way as in the process of FIG. 6 (S22). The ensuing processes are the same as those of step S32 and subsequent steps of FIG. 7.

According to the process of FIG. 8, the control device can be easily realized by hardware. Since the control device is realized by hardware, the control device can be realized without putting a burden on software.

Figure 9:
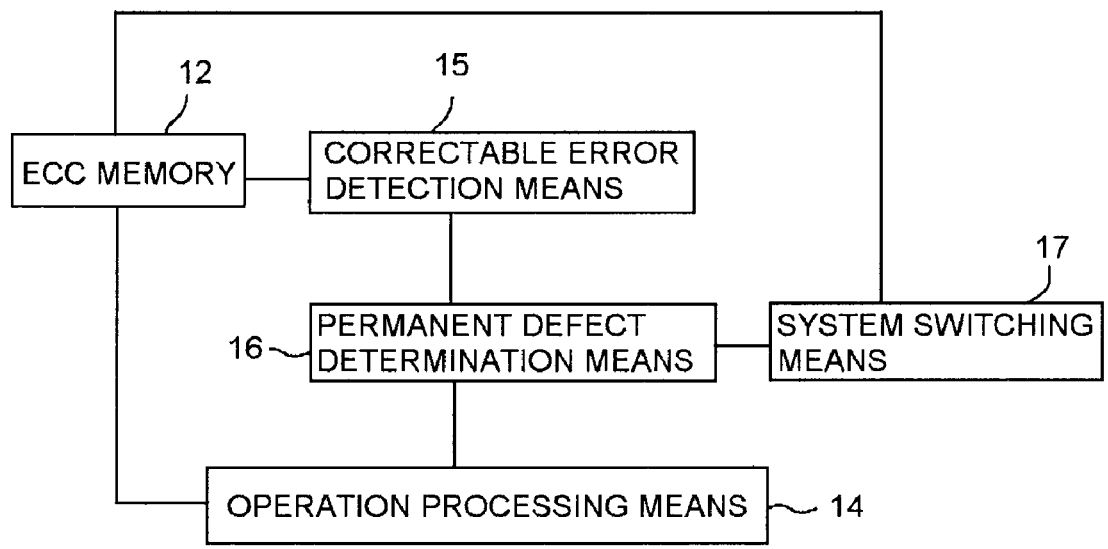
FIG. 9 is a configuration diagram of a control device according to a third embodiment of the present invention.

FIG. 9 is a configuration diagram of a control device according to a third embodiment of the present invention. According to the third embodiment, as opposed to the second embodiment illustrated in FIG. 5, only a system switching means 17 is added. The same elements as those of the second embodiment illustrated in FIG. 5 are denoted by the same reference symbols and the corresponding parts will not be described.

The system switching means 17 switches to a standby system when an element from which a permanent defect is detected by the permanent defect determination means 16 is multiplexed and when the element belongs to a normally used system.

Figure 10:
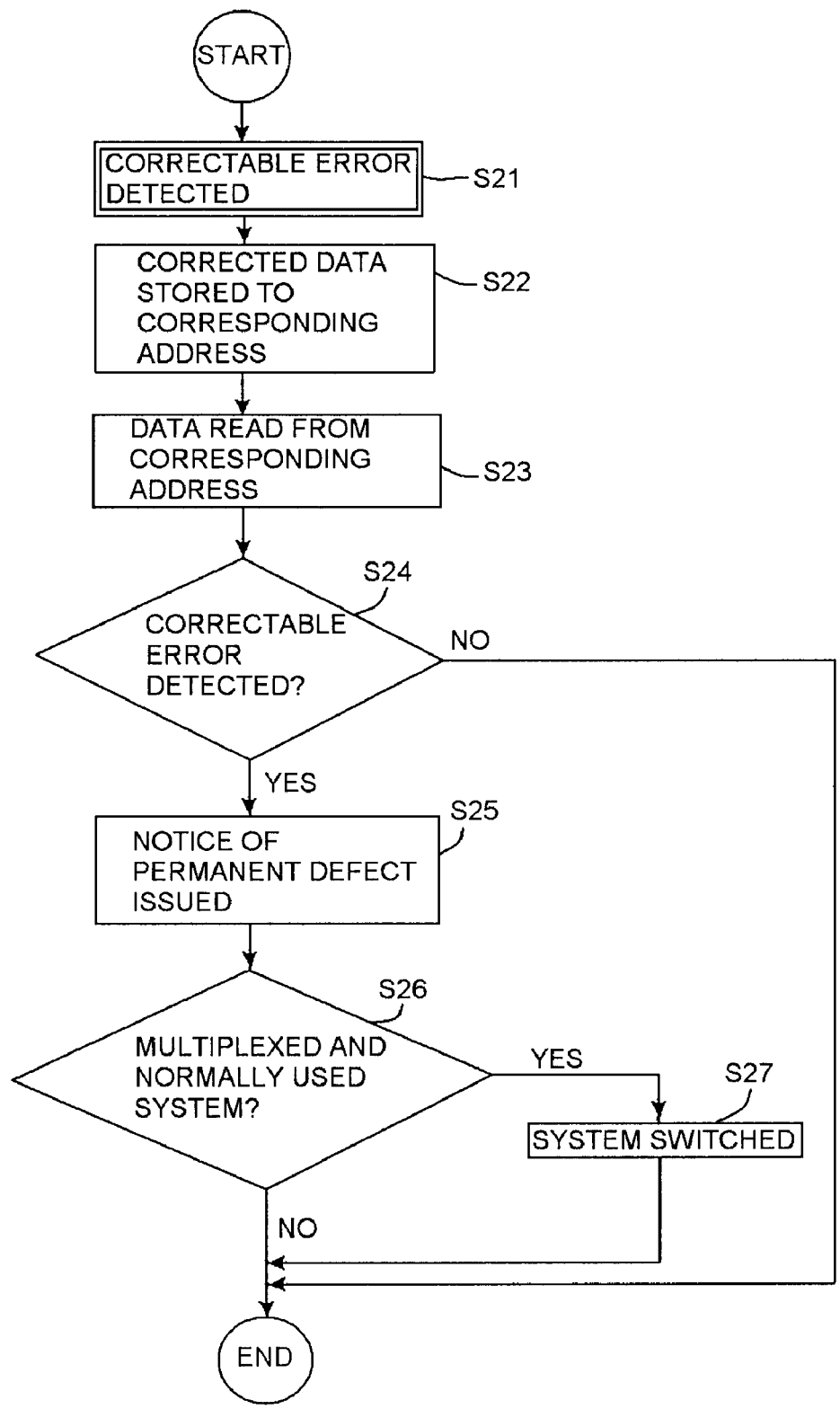
FIG. 10 is a flowchart illustrating an example of the process of a permanent defect determination means and a system switching means of the control device according to the third embodiment of the present invention.

FIG. 10 is a flowchart illustrating an example of the process of the permanent defect determination means 16 and the system switching means 17 of the control device according to the third embodiment of the present invention. When a correctable error is detected by the correctable error detection means 15 (S21), then the corrected data is stored to the corresponding address (S22) and data is read from the corresponding address (S22). At this time, a determination is made as to whether error correction is made, i.e. whether a correctable error is detected (S24). When a correctable error is detected, the notice that the corresponding address has a permanent defect is issued (S25). Then, a determination is made as to whether the element from which the permanent defect is detected is multiplexed and whether the element belongs to the normally used system (S26). When the element from which the permanent defect is detected is multiplexed and belongs to the normally used system, the system switching means 17 switches to the standby system (S27).

Figure 11:
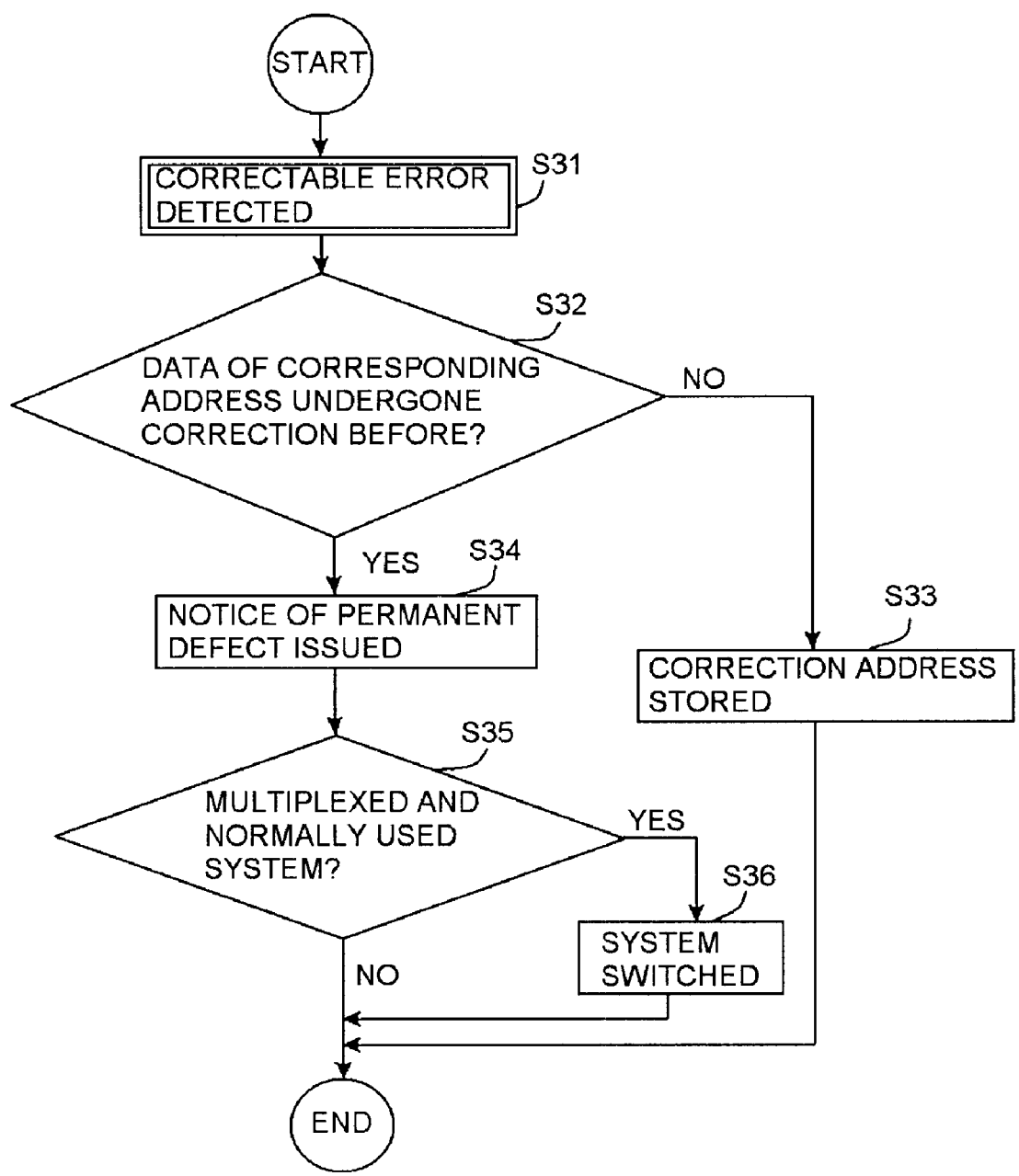
FIG. 11 is a flowchart illustrating another example of the process of the permanent defect determination means and the system switching means of the control device according to the third embodiment of the present invention.

FIG. 11 is a flowchart illustrating another example of the process of the permanent defect determination means 16 and the system switching means 17 of the control device according to the third embodiment of the present invention. When a correctable error is detected by the correctable error detection means 15 (S31), a determination is made as to whether the data of the corresponding address has undergone correction before (S32). When the data has not undergone correction, the correction address is stored (S33). When the data has undergone correction, then the notice of permanent defect is issued (S34). Then, a determination is made as to whether the element from which the permanent defect is detected is multiplexed and whether the element belongs to the normally used system (S35). When the element from which the permanent defect is detected is multiplexed and belongs to the normally used system, the system switching means 17 switches to the standby system (S36).

As described above, when the element from which the permanent defect is detected is multiplexed and belongs to the normally used system, the system switching means 17 switches to the standby system. Therefore, it is possible to maintain the system of the ECC memory 12 that has permanent defects and prevent permanent defects from accumulating and turning into uncorrectable ones without any sign of what is about to happen. Moreover, when one system continues to operate after the failure of the other systems and when a permanent defect is detected, one thing to be done is to issue notice. Therefore, it is possible to increase operation rates without stopping the system.

In the process of FIG. 11, like the process of FIG. 7, the operation of access to the memory is performed fewer times at the time of detection of correctable errors. Therefore, it is easy to realize the control device using hardware. Since the control device is realized by hardware, the control device can be realized without putting a burden on software.

Figure 12:
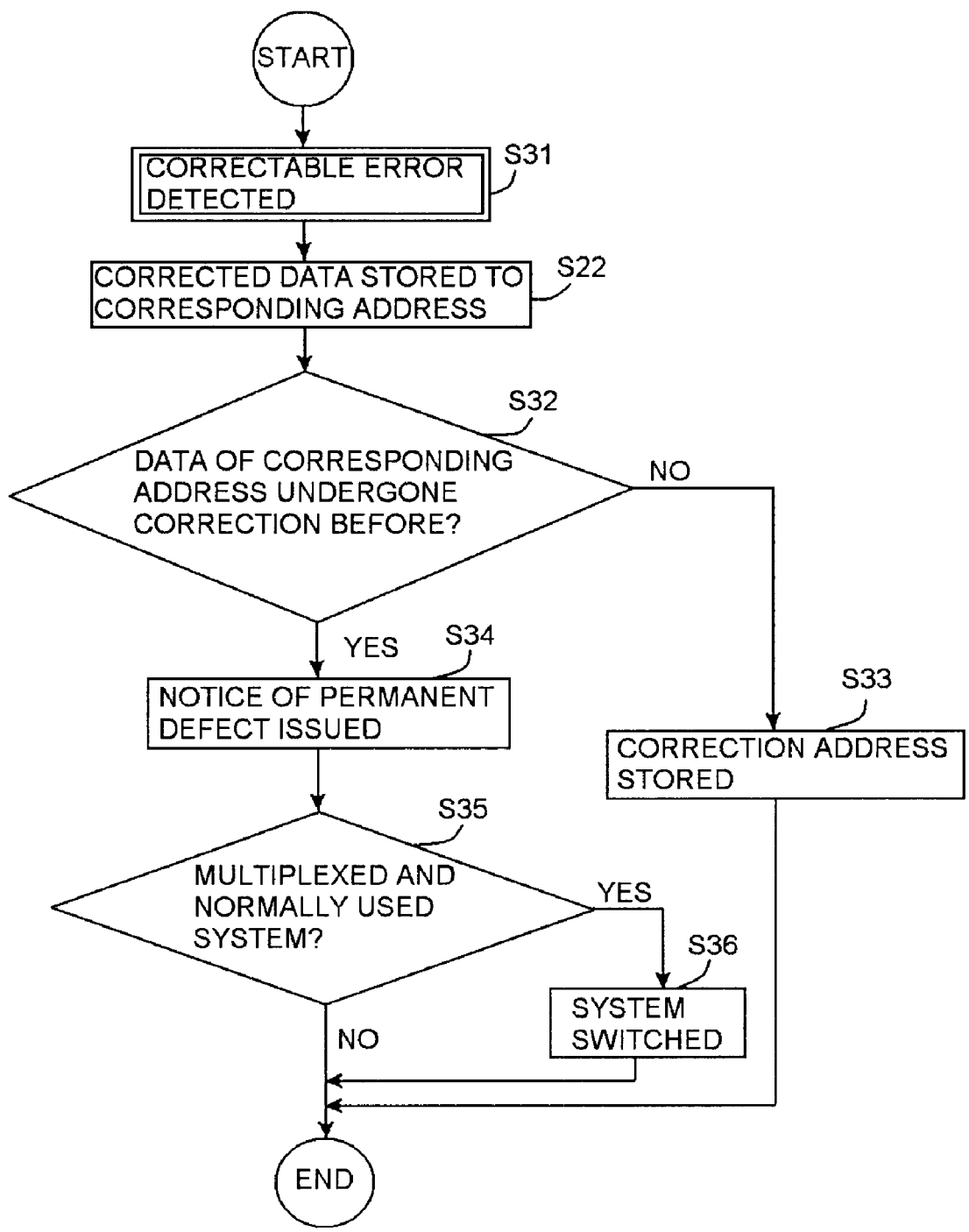
FIG. 12 is a flowchart illustrating another example of the process of the permanent defect determination means of the control device according to the third embodiment of the present invention.

FIG. 12 is a flowchart illustrating another example of the process of the permanent defect determination means of the control device according to the third embodiment of the present invention. In the example here, when a correctable error is detected by the correctable error detection means 15 (S31), the corrected data is stored to the corresponding address in the same way as in the process of FIG. 10 (S22). The ensuing processes are the same as those of step S32 and subsequent steps of FIG. 11.

According to the process of FIG. 12, the control device can be easily realized by hardware. Since the control device is realized by hardware, the control device can be realized without putting a burden on software.

Figure 13:
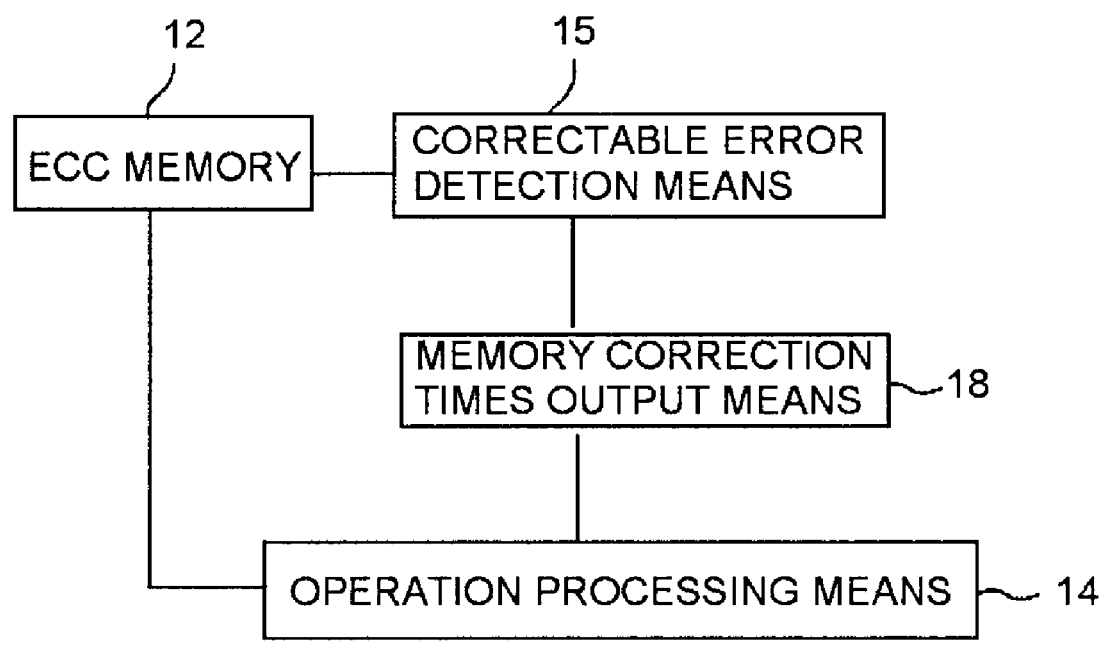
FIG. 13 is a configuration diagram of a control device according to a fourth embodiment of the present invention.

FIG. 13 is a configuration diagram of a control device according to a fourth embodiment of the present invention. According to the fourth embodiment, as opposed to the second embodiment illustrated in FIG. 5, instead of the permanent defect determination means 16, a memory correction times output means 18 is provided. The memory correction times output means 18 counts up the number of correction times when error correction is made during a process of reading data of the ECC memory 12 and outputs the counted value.

Figure 14:
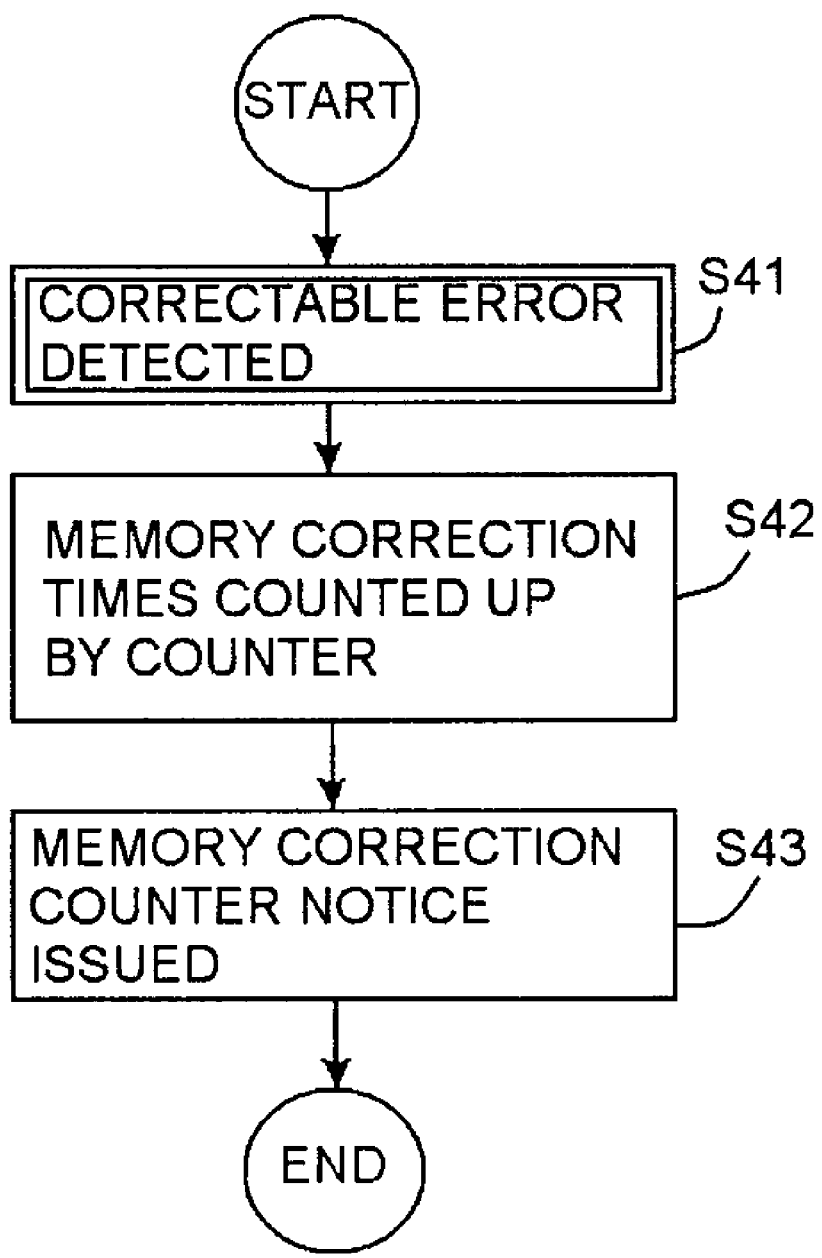
FIG. 14 is a flowchart illustrating an example of the process of a memory correction times output means of the control device according to the fourth embodiment of the present invention.

FIG. 14 is a flowchart illustrating an example of the process of the memory correction times output means 18 of the control device according to the fourth embodiment of the present invention. When a correctable error is detected by the correctable error detection means 15 (S41), a counter counts up the memory correction times (S42). Then, a memory correction counter notice is issued (S43). In this manner, in the control device using the ECC memory 12, when error correction is made during a process of reading out data, the counter counts up and the notice of the counted value is issued.

When a correctable permanent defect occurs in the ECC memory 12, the counter counts up each time data is read from the corresponding area. Therefore, the intervals at which the counter counts up are considered to be shorter after the permanent defect occurs than before. Therefore, owing to the above function, it is possible to detect the existence of permanent defects of the ECC memory 12 and prevent permanent defects from accumulating and turning into uncorrectable ones without any sign of what is about to happen.

Figure 15:
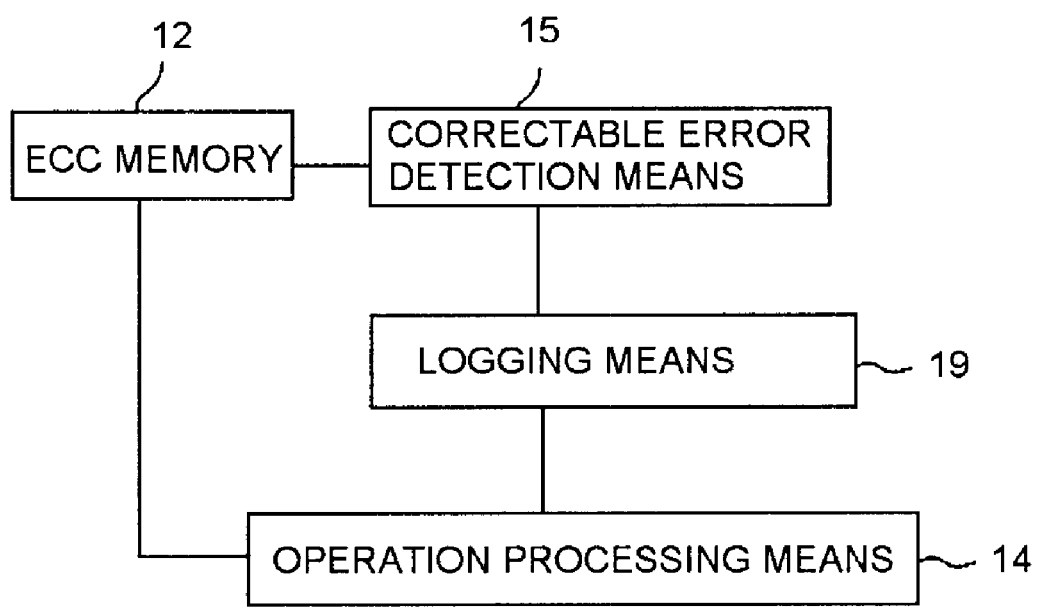
FIG. 15 is a configuration diagram of a control device according to a fifth embodiment of the present invention.

FIG. 15 is a configuration diagram of a control device according to a fifth embodiment of the present invention.

Figure 16:
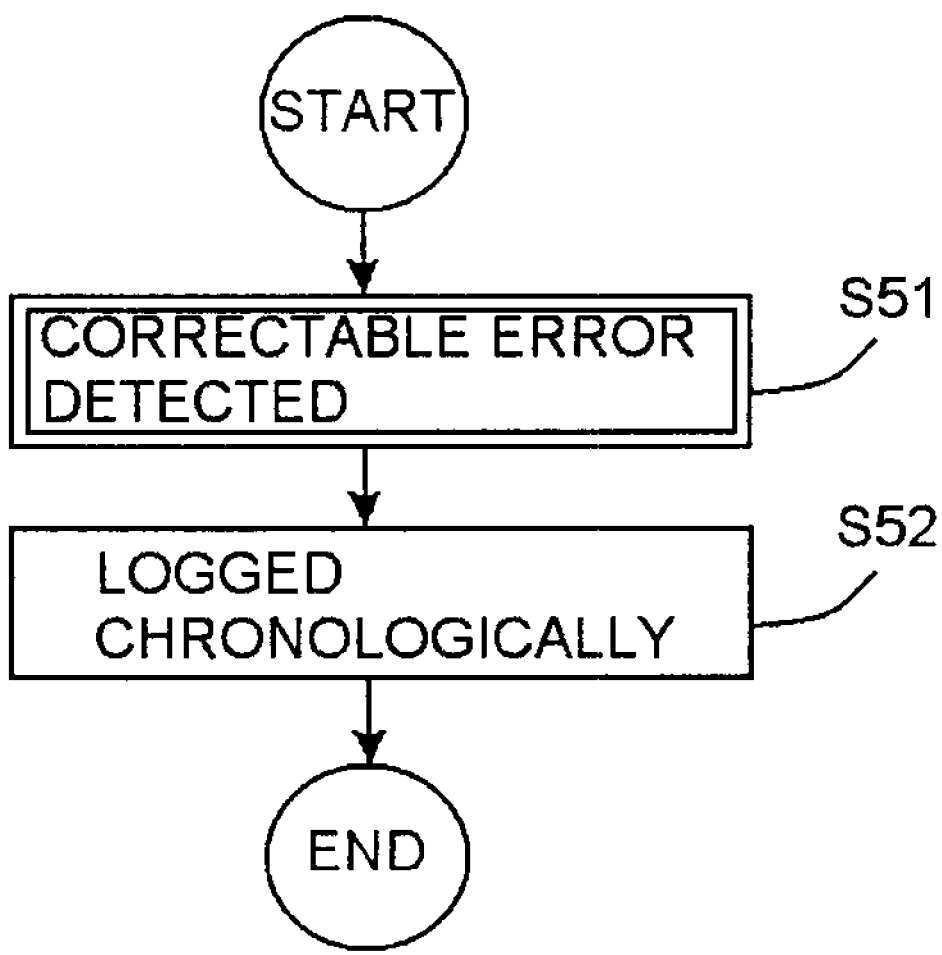
FIG. 16 is a flowchart illustrating an example of the process of a logging means of the control device according to the fifth embodiment of the present invention.

According to the fifth embodiment, as opposed to the second embodiment illustrated in FIG. 5, instead of the permanent defect determination means 16, a logging means 19 is provided. The logging means 19 logs correction events in chronological order when error correction is made during a process of reading out data of the ECC memory 12. FIG. 16 is a flowchart illustrating an example of the process of the logging means 19 of the control device according to the fifth embodiment of the present invention. When a correctable error is detected by the correctable error detection means 15 (S51), the logging means 19 logs a correctable error (S52).

Therefore, in the control device using the ECC memory 12, when error correction is made during a process of reading out data, correction events are logged in chronological order. When a permanent defect occurs, a correction event is logged each time data is read from the corresponding area. Therefore, the intervals at which a correction event is logged are considered to be shorter after the permanent defect occurs than before. Thus, by regularly collecting the log, it is possible to detect the existence of permanent defects of the ECC memory 12 and prevent permanent defects from accumulating and turning into uncorrectable ones without any sign of what is about to happen.

What is claimed is:

1. A control device comprising:
    memory diagnosis means for setting a power-on status when an electric power is turned on and diagnosing an ECC memory;
    restarting means for restarting the control device when the memory diagnosis means detects a correctable error of the ECC memory during the power-on status of the ECC memory; and
    operation processing means for resetting the power-on status and performing a normal operation when the memory diagnosis means does not detect a correctable error of the ECC memory, while performing the normal operation when a correctable error of the ECC memory is detected because of the restart of the control device by soft reset after the reset of the power-on status but when the control device is not in the power-on status.

2. The control device according to claim 1, further comprising
    uncorrectable state restarting means for restarting the control device when the memory diagnosis means detects an uncorrectable error of the ECC memory during the power-on status of the ECC memory.

3. The control device according to claim 1, wherein:
    when the memory diagnosis means restarts the control device during the normal operation after the power-on status is cleared, the restarting means counts the number of restart times, and, when the number of restart times exceeds a predetermined value, the restarting means issues a notice of permanent defect; and,
    when the notice of permanent defect is inputted from the restarting means, the operation processing means clears the number of successive restart times and performs the normal operation.

4. The control device according to claim 3, wherein
    the restarting means directly restarts the control device when an element from which a correctable error is detected by the memory diagnosis means is multiplexed.

* * * * *